(12) United States Patent
Sato et al.

(10) Patent No.: US 10,451,683 B2
(45) Date of Patent: Oct. 22, 2019

(54) SECONDARY BATTERY STATE DETECTION DEVICE AND SECONDARY BATTERY STATE DETECTION METHOD

(71) Applicants: FURUKAWA ELECTRIC CO., LTD., Tokyo (JP); FURUKAWA AUTOMOTIVE SYSTEMS INC., Shiga (JP)

(72) Inventors: Etsuzo Sato, Shiga (JP); Takezo Sugimura, Tokyo (JP); Yuichi Watanabe, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 872 days.

(21) Appl. No.: 14/449,641

(22) Filed: Aug. 1, 2014

(65) Prior Publication Data

US 2014/0347059 A1 Nov. 27, 2014

Related U.S. Application Data

(63) Continuation of application No. PCT/JP2013/055741, filed on Mar. 1, 2013.

(30) Foreign Application Priority Data

Mar. 3, 2012 (JP) .................................. 2012-047442

(51) Int. Cl.
*G01R 31/392* (2019.01)
*G01R 31/387* (2019.01)
(Continued)

(52) U.S. Cl.
CPC ........ *G01R 31/392* (2019.01); *F02N 11/0862* (2013.01); *G01R 31/3647* (2019.01);
(Continued)

(58) Field of Classification Search
CPC .......... H02J 7/14; H02J 7/0057; H02J 7/0029; H02J 2007/005; G01R 31/2679;
(Continued)

(56) References Cited

U.S. PATENT DOCUMENTS 6,646,419 B1 * 11/2003 Ying ..................... B60W 10/26
320/132
2009/0217897 A1 * 9/2009 Hartmann ............... F02N 11/08
123/179.3
(Continued)

FOREIGN PATENT DOCUMENTS

JP  2006-284537 A  10/2006
JP  2007-179968 A  7/2007
(Continued)

OTHER PUBLICATIONS

International Search Report for PCT Application No. PCT/JP2013/055741, dated May 14, 2013, 2 pages.

*Primary Examiner* — Nathaniel R Pelton
*Assistant Examiner* — Michael N Dibenedetto
(74) *Attorney, Agent, or Firm* — Amin, Turocy & Watson, LLP

(57) ABSTRACT

To accurately determine whether an engine can be started while accurately detecting a degree of deterioration of a secondary battery, in a secondary battery state detecting device detecting a state of a secondary battery mounted on a vehicle, a measurement unit measures a value of an internal resistance of the secondary battery at an engine stop time. An estimation unit estimates a value of a diffusion resistance resulting from diffusion of an ion generated at an electrolytic solution of the secondary battery by supplying electric power to a starter motor at a starting time of the engine. A calculation unit calculates a starting voltage being a voltage for the starting of the engine from a resistance value obtained by adding the value of the diffusion resistance estimated by the estimation unit to the value of the internal resistance measured by the measurement unit.

13 Claims, 6 Drawing Sheets

(51) Int. Cl.
*G01R 31/389* (2019.01)
*H01M 10/48* (2006.01)
*F02N 11/08* (2006.01)
*H02J 7/00* (2006.01)
*G01R 31/36* (2019.01)

(52) U.S. Cl.
CPC ......... *G01R 31/387* (2019.01); *G01R 31/389* (2019.01); *H01M 10/48* (2013.01); *H02J 7/0021* (2013.01); *H01M 2220/20* (2013.01)

(58) Field of Classification Search
CPC ............ G01R 31/3634; G01R 31/3662; G01R 31/3693; G01R 31/3606; G01R 31/361; G01R 31/3613; G01R 31/3624; G01R 31/3679; G01R 31/3675; H01M 10/48; F02N 11/0862
USPC .................. 320/127–165; 180/65.29; 702/64; 903/905; 701/22; 324/430
See application file for complete search history.

(56) References Cited

U.S. PATENT DOCUMENTS

| | | | |
|---|---|---|---|
| 2010/0250038 A1* | 9/2010 | Morita et al. ............. | H02J 7/00 320/136 |
| 2012/0109443 A1* | 5/2012 | Takahashi et al. ... | B60W 10/26 701/22 |
| 2012/0290234 A1* | 11/2012 | Schaefer ............ | G01R 31/3624 702/63 |

FOREIGN PATENT DOCUMENTS

| | | | | |
|---|---|---|---|---|
| JP | 2007179968 A | * | 7/2007 | |
| JP | 2009-244179 A | | 10/2009 | |
| JP | 2011-15520 A | * | 1/2011 | ................ B60L 3/00 |

\* cited by examiner

SECONDARY BATTERY STATE DETECTION DEVICE AND SECONDARY BATTERY STATE DETECTION METHOD

RELATED APPLICATIONS

This application is a continuation of, and claims priority to, PCT Application No. PCT/JP2013/055741, filed Mar. 1, 2013, and entitled "SECONDARY BATTERY STATE DETECTION DEVICE AND SECONDARY BATTERY STATE DETECTION METHOD," which claims priority to Japanese Application No. 2012-047442, filed Mar. 3, 2012. The entireties of these applications are incorporated by reference.

TECHNICAL FIELD

The present invention relates to a secondary battery state detecting device and a secondary battery state detecting method.

BACKGROUND ART

In Patent Document 1, an art making a secondary battery perform pulse-discharge in an approximately rectangular shape, sampling a response voltage at that time to expand to a rectangular wave components perpendicular mutually, calculating a pseudo impedance of the secondary battery from an obtained coefficient and current value, and determining deterioration of a secondary battery based on the pseudo impedance, is disclosed.

PRIOR ART DOCUMENT

Patent Document

Patent Document 1: Japanese Patent Application Laid-open No. 2006-284537

SUMMARY OF THE INVENTION

Problem to be Solved by the Invention

In the art disclosed in Patent Document 1, a charge level of the secondary battery is lowered if the pulse-discharge is continued for a long time. Besides, it is necessary to use a resistance element whose capacitance is large to enable the discharge for a long time, and therefore, a size of a device becomes large. Therefore, a time for the pulse-discharge is limited for a short period of time because of these reasons.

Incidentally, there are kinds of resistances as illustrated in FIG. 6 in the resistances of the secondary battery. Namely, there are a conductor resistance, a positive/negative electrode reaction resistance, and a diffusion resistance. Here, the conductor resistance and the positive/negative electrode reaction resistance increase in accordance with deterioration of the secondary battery. The diffusion resistance is not affected by the deterioration of the secondary battery.

A most important object to measure an internal resistance of the secondary battery is to detect a degree of deterioration of the secondary battery. A discharge time when the internal resistance is measured is set at a range suitable for a deterioration determination illustrated in FIG. 6, and thereby, a highly accurate detection of degree of deterioration is enabled.

On the other hand, when an engine is started, the discharge time continues for a longer period of time than the case when the internal resistance is measured (the discharge time at the engine start time illustrated in FIG. 6), and therefore, the internal resistance increases for an extent of the diffusion resistance as illustrated in FIG. 6.

Many methods to measure the internal resistance from a current, a voltage response at the engine start time have been devised to estimate an engine starting voltage, but there are problems in which the degree of deterioration of a battery cannot be correctly detected, the internal resistance cannot be measured other than the engine start time, and so on.

An object of the present invention is to provide a secondary battery state detecting device and a secondary battery state detecting method capable of accurately determining whether or not it is possible to start the engine while accurately detecting the degree of deterioration of the secondary battery.

Means for Solving the Problems

To solve the above-stated problems, the present invention is characterized in that: a measurement unit measuring a value of an internal resistance of a secondary battery at an engine stop time; an estimation unit estimating a value of a diffusion resistance resulting from diffusion of an ion generated at an electrolytic solution of the secondary battery by supplying electric power to a starter motor at a starting time of the engine; and a calculation unit calculating a starting voltage being a voltage required for the starting of the engine from a resistance value obtained by adding the value of the diffusion resistance estimated by the estimation unit to the value of the internal resistance measured by the measurement unit, a starting current flowing when the engine is started, and a voltage before starting of the secondary battery, are included in a secondary battery state detecting device detecting a state of the secondary battery mounted on a vehicle.

According to the constitution as stated above, it becomes possible to accurately determine whether or not it is possible to start the engine while accurately detecting a degree of deterioration of the secondary battery.

Another invention is characterized in that: the estimation unit estimates the value of the diffusion resistance based on a discharge current, a discharge time at the starting time of the engine, and a temperature of the secondary battery in addition to the above-stated invention.

According to the constitution as stated above, it is possible to accurately find the diffusion resistance by using these three parameters.

Still another invention is characterized in that: the estimation unit estimates the value of the diffusion resistance by setting at least one of the discharge current, the discharge time, and the temperature of the secondary battery as a fixed value, and setting the others as variable values, and an obtained value of the diffusion resistance is corrected based on a parameter which is set as the fixed value in addition to the above-stated invention.

According to the constitution as stated above, it is possible to find the diffusion resistance by using a simple relational expression or table by fixing at least one parameter.

Still another invention is characterized in that: the estimation unit sets the temperature as the fixed value, the discharge current and the discharge time as the variable values, estimates the value of the diffusion resistance based on the discharge current and the discharge time at a predetermined temperature, and corrects the value of the estimated diffusion resistance based on an actually measured temperature of the secondary battery in addition to the above-stated invention.

According to the constitution as stated above, it is possible to find the diffusion resistance more easily by setting the temperature whose variation is relatively large as the fixed parameter.

Besides, the present invention is characterized in that: a measurement step measuring a value of an internal resistance of a secondary battery at an engine stop time; an estimation step estimating a value of a diffusion resistance resulting from diffusion of an ion generated at an electrolytic solution of the secondary battery by supplying electric power to a starter motor at a starting time of the engine; and a calculation step calculating a starting voltage being a voltage required for the starting of the engine from a resistance value obtained by adding the value of the diffusion resistance estimated at the estimation step to the value of the internal resistance measured at the measurement step, a starting current flowing when the engine is started, and a voltage before starting of the secondary battery, are included in a secondary battery state detecting method detecting a state of the secondary battery mounted on a vehicle.

According to the method as stated above, it becomes possible to accurately determine whether or not it is possible to start the engine while accurately detecting a degree of deterioration of the secondary battery.

EFFECT OF THE INVENTION

According to the present invention, it is possible to provide a secondary battery state detecting device and a secondary battery state detecting device method capable of accurately determining whether or not it is possible to start an engine while accurately detecting a degree of deterioration of a secondary battery.

BEST MODE FOR CARRYING OUT THE INVENTION

Next, embodiments of the present invention are described.

(A) Description of Configuration of Embodiment

Figure 1:
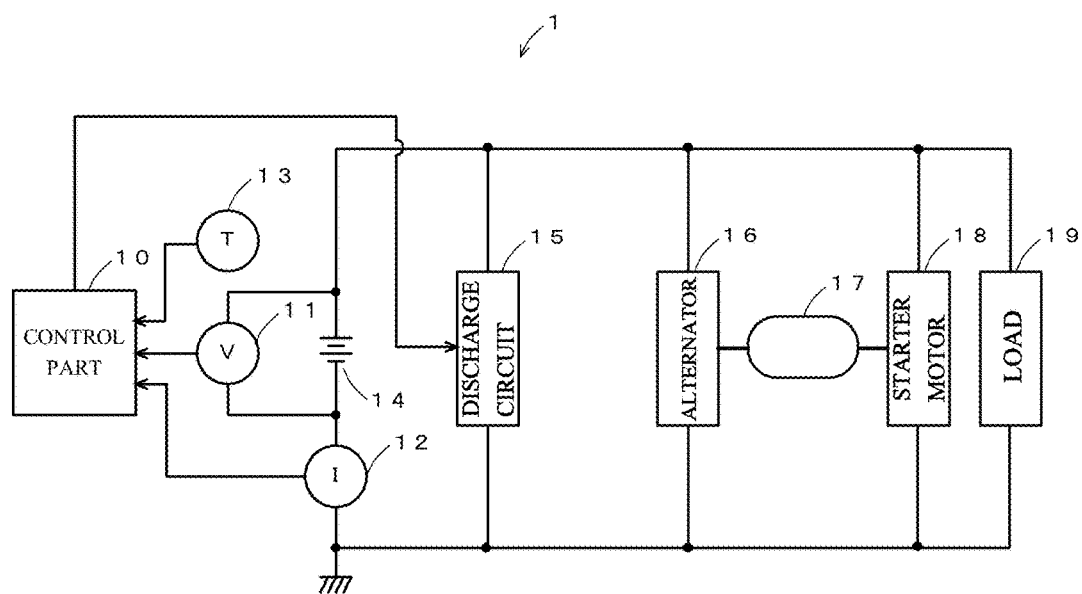
FIG. 1 is a view illustrating a configuration example of a secondary battery state detecting device according to an embodiment of the present invention.

FIG. 1 is a view illustrating a power supply system of a vehicle having a secondary battery state detecting device according to an embodiment of the present invention. In this view, a secondary battery state detecting device 1 includes a control part 10, a voltage sensor 11, a current sensor 12, a temperature sensor 13, and a discharge circuit 15 as major components, and detects a state of a secondary battery 14. Here, the control part 10 refers to outputs from the voltage sensor 11, the current sensor 12, and the temperature sensor 13 to detect the state of the secondary battery 14. The voltage sensor 11 detects a terminal voltage of the secondary battery 14, and notifies the control part 10. The current sensor 12 detects a current flowing in the secondary battery 14, and notifies the control part 10. The temperature sensor 13 detects an environmental temperature of the secondary battery 14 in itself or a periphery thereof, and notifies the control part 10. The discharge circuit 15 is made up of, for example, a semiconductor switch, a resistance element, and so on which are connected in series, and it makes the secondary battery 14 perform intermittent discharge by an on/off control of the semiconductor switch by the control part 10. The control part 10 finds an internal resistance of the secondary battery 14 from the voltage and the current when the intermittent discharge is performed.

The secondary battery 14 is made up of, for example, a flooded lead-acid battery and so on using lead dioxide for a positive electrode (positive plate), spongy lead for a negative electrode (negative plate), and dilute sulfuric acid as an electrolytic solution, is charged by an alternator 16, drives a starter motor 18 to start an engine 17 and supplies electric power to a load 19. The alternator 16 is driven by the engine 17, generates an alternating-current power, converts into a direct-current power by a rectifying circuit, and charges the secondary battery 14.

The engine 17 is made up of, for example, a reciprocal engine such as a gasoline engine and a diesel engine, or a rotary engine, and so on, started by the starter motor 18, drives a driving wheel via a transmission to provide a vehicle with a propulsive force, and generates electric power by driving the alternator 16. The starter motor 18 is made up of, for example, a direct current motor, generates a rotational force by the electric power supplied from the secondary battery 14, and starts the engine 17. The load 19 is made up of, for example, an electric steering motor, a defogger, an ignition coil, a car audio, a car navigation, and so on, and operated by the electric power from the secondary battery 14.

Figure 2:
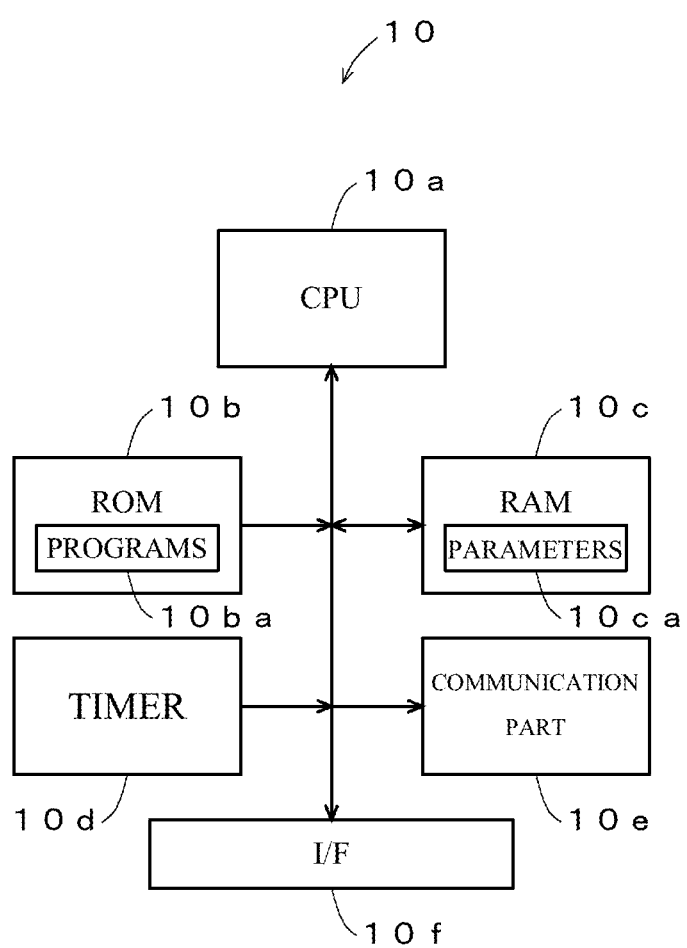
FIG. 2 is a block diagram illustrating a detailed configuration example of a control part illustrated in FIG. 1.

FIG. 2 is a view illustrating a detailed configuration example of the control part 10 illustrated in FIG. 1. As illustrated in this drawing, the control part 10 includes a CPU (Central Processing Unit) 10a, a ROM (Read Only Memory) 10b, a RAM (Random Access Memory) 10c, a timer 10d, a communication part 10e, and an I/F (Interface) 10f. Here, the CPU 10a controls each part based on programs 10ba stored at the ROM 10b. The ROM 10b is made up of a semiconductor memory, and so on, and stores the programs 10ba, and so on. The RAM 10c is made up of a semiconductor memory, and so on, and stores parameters 10ca generated when the programs 10ba are executed. The timer 10d clocks and outputs a time. The communication part 10e is connected to the other devices (for example, a not-illustrated ECU (Engine Control Unit)) and so on via a communication line, and gives and receives information between the other devices. The I/F 10f converts signals supplied from the voltage sensor 11, the current sensor 12, and the temperature sensor 13 into digital signals, downloads them, and supplies a drive current to the discharge circuit 15 to control it.

(B) Description of Schematic Operations of Embodiment

Next, schematic operations of the embodiment are described with reference to FIG. 3 to FIG. 5. In the present embodiment, a starting voltage being a voltage of the secondary battery 14 capable of starting the engine 17 is found. Note that the starting voltage can be found by the following expression (1).

Starting voltage=Voltage before starting+Starting current×Internal resistance (1)

Here, the voltage before starting is a voltage of the secondary battery 14 before electricity to the starter motor 18 is turned on, the starting current is a current flowing during the starter motor 18 is rotating, and the internal resistance is an internal resistance component of the secondary battery 14. Note that the internal resistance can be obtained by, for example, adding a value measured based on a voltage and a current while making the secondary battery 14 intermittently pulse-discharged by the discharge circuit 15 during the engine 17's stop, to a diffusion resistance found by the later-described method. Besides, it is desirable that a point when the voltage becomes the lowest other than an inrush current during cranking of the engine 17, namely a point when a torque of the starter motor 18 becomes the maximum (hereinafter it is called as a "maximum torque point") is used as the starting current. Note that the maximum torque point can be found by, for example, detecting a minimum value of the current.

Figure 6:
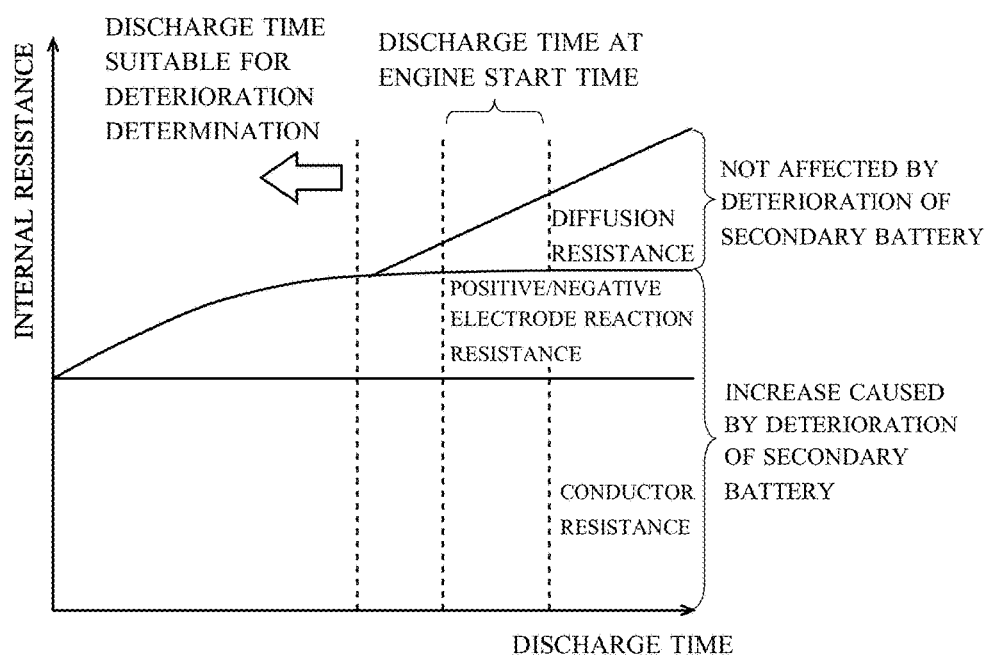
FIG. 6 is a view illustrating a change of various kinds of internal resistances depending on the discharge time.

Note that there are the conductor resistance, a positive/negative reaction resistance, and the diffusion resistance in the internal resistance as illustrated in FIG. 6. Here, the conductor resistance is a resistance relating to an electron conduction of an electrode plate. The positive/negative reaction resistance is a moving resistance of an electric charge between an electrolytic solution and an active-material interface. Besides, the diffusion resistance relates to a charge and discharge reaction of an ion (a sulfate ion in case of a lead-acid storage battery) in the electrolytic solution of the secondary battery, the ion is consumed by an active material and an electrolytic solution concentration is lowered at a discharge time, the ion is released and the electrolytic solution concentration increases at a charge time. Accordingly, a concentration gradient of the ion occurs in a vicinity of the electrode, and the diffusion resistance is generated resulting from this concentration gradient. As stated above, the diffusion resistance increases at the starting time of the engine 17, and therefore, an internal resistance value increases for a degree of the diffusion resistance compared to the internal resistance measured by the pulse-discharge. Accordingly, a voltage drop caused by the internal resistance becomes large for the degree of the diffusion resistance when the diffusion resistance is not considered, and there is a case when the engine 17 cannot be started even though it is judged that the starting of the engine 17 is possible by a determination based on a starting voltage Vs.

In the present embodiment, the diffusion resistance is therefore estimated to be added to the internal resistance, and the starting voltage is found based on the obtained value. It is thereby possible to obtain an accurate starting voltage, and therefore, it is possible to accurately determine the starting capability.

Figure 3:
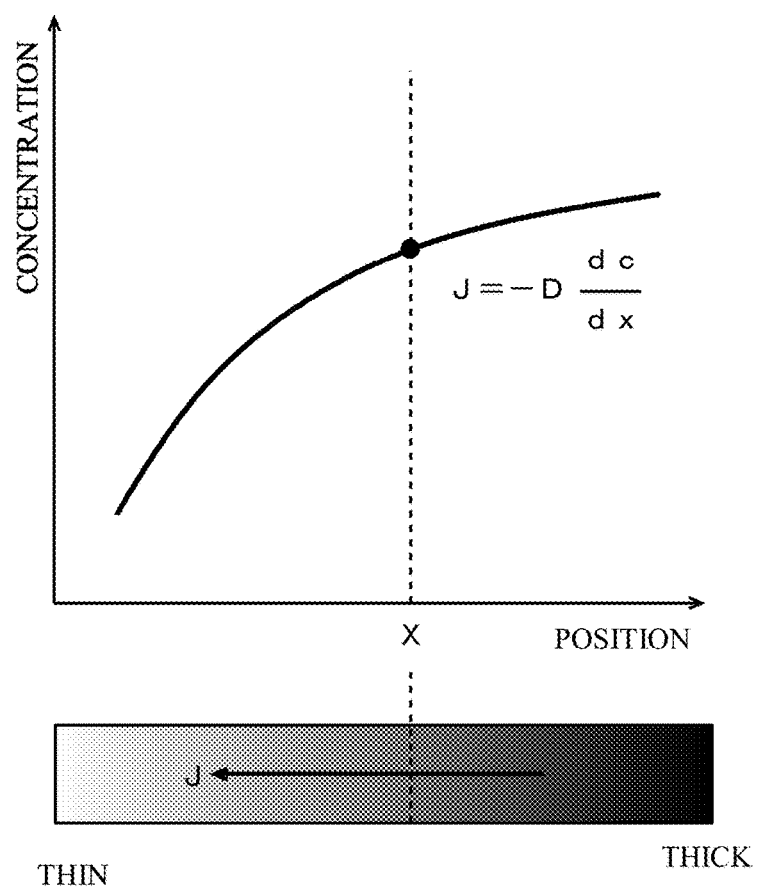
FIG. 3 is a view to explain Fick's first law representing a relationship in a steady diffusion.

FIG. 3 is a view to explain Fick's first law representing a relationship in a steady diffusion. In this view, a horizontal axis represents a position, and a vertical axis represents a concentration. In this view, "J" represents a diffusion flux or a flux, and it is defined as an amount of a certain characteristic passing through a unit area per unit time. For example, when the mass passes, a dimension is given by $[ML^{-2}T^{-1}]$. "D" represents a diffusion coefficient in dimensions of $[L^2T^{-1}]$, "c" represents a concentration in dimensions of $[ML^{-3}]$, and "x" represents a position in dimensions of $[L]$. Here, the diffusion coefficient D is defined by a temperature, and a concentration gradient dc/dx is defined by a discharge time and a discharge current. Accordingly, in the present embodiment, the diffusion resistance is found based on the discharge current, the discharge time, and the temperature of the secondary battery 14 at the starting time of the engine 17.

Figure 4:
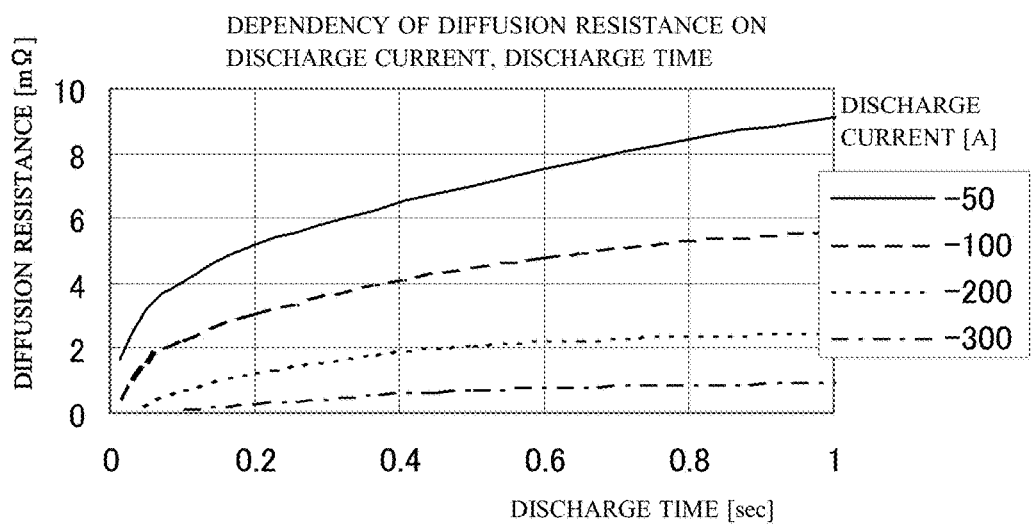
FIG. 4 is a view illustrating a relationship among a discharge current, a discharge time, and a diffusion resistance.
Figure 5:
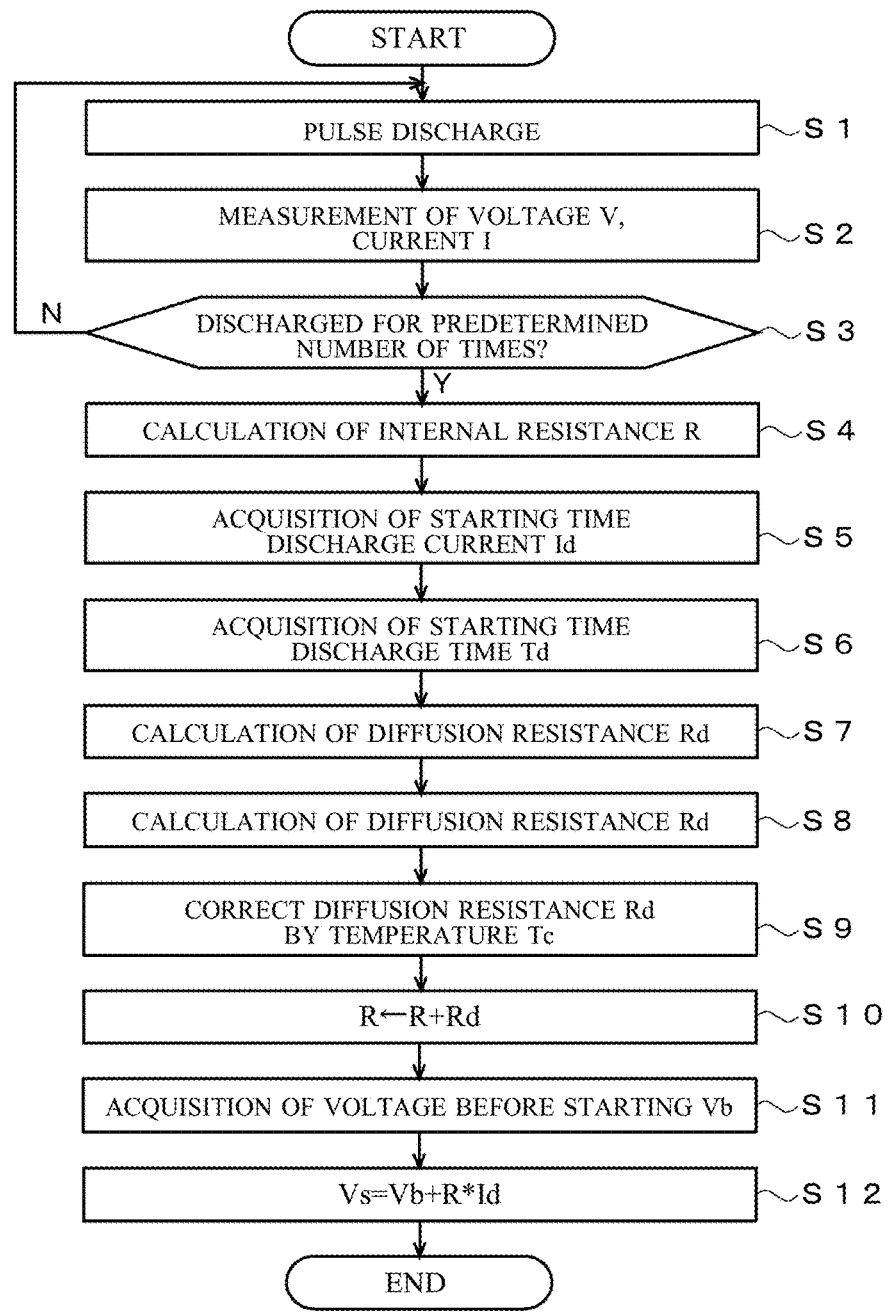
FIG. 5 is a flowchart explaining an example of a process executed in the embodiment illustrated in FIG. 1.

FIG. 4 is a view illustrating a relationship among the discharge time, the discharge current, and the diffusion resistance at a predetermined temperature. As illustrated in FIG. 4, the diffusion resistance becomes large as the discharge time becomes long, and becomes large as the current becomes small. In the present embodiment, for example, an average value of the discharge currents and an average value of the discharge times at the starting times of past plural times are found, the diffusion resistance at the predetermined temperature (for example, 25° C.) is found based on the above by using a graph as illustrated in FIG. 4, this found diffusion resistance is corrected in accordance with the temperature of the secondary battery 14, a value of the diffusion resistance obtained by the correction is added to a value of the internal resistance found by the pulse-discharge by the discharge circuit 15 at the stop time of the engine 17, the obtained value is substituted to the above-stated expression (1), and thereby, an accurate starting voltage is found.

Next, detailed operations of the embodiment of the present invention are described with reference to FIG. 5. FIG. 5 is a flowchart to explain an example of a process executed in the embodiment illustrated in FIG. 1. The flowchart illustrated in FIG. 5 is executed at a predetermined cycle (for example, every several hours or every several days) when the engine 17 stops. When the process in this flowchart is executed, the following steps are executed.

In step S1, the CPU 10a makes the secondary battery 14 perform pulse-discharge by on/off controlling the discharge circuit 15 via the I/F 10f. Specifically, for example, the secondary battery 14 is discharged by a rectangular pulse having a pulse width of millisecond order. It goes without saying that the pulse width may be ones other than the above.

In step S2, the CPU 10a acquires a voltage V and a current I at the pulse-discharge time by the voltage sensor 11 and the current sensor 12.

In step S3, the CPU 10a determines whether or not the pulse-discharge is performed for a predetermined number of times, when it is determined that the predetermined number of times of pulse-discharges are performed (step S3: Yes), the process goes to step S4, and in other cases (step S3: No), the process returns to the step S1 to repeat the similar processes as the case as stated above. For example, when the pulse-discharges are repeated for several dozen times, the process goes to the step S4. It goes without saying that the number of times may be ones other than the above.

The pulse-discharges of the secondary battery 14 are performed for the predetermined number of times by the discharge circuit 15 by the processes of the above-stated steps S1 to S3, and the voltages V and the currents I at that times are measured by the voltage sensor 11 and the current sensor 12.

In the step S4, the CPU 10a finds an internal resistance R of the secondary battery 14 based on the voltages V and the currents I of the secondary battery 14 at the pulse-discharge times measured in the repeating processes of the steps S1 to S3. Note that the internal resistance R found as stated above corresponds to the conductor resistance and the positive/negative reaction resistance illustrated in FIG. 6.

In step S5, the CPU 10a acquires a starting time discharge current Id. Here, the starting time discharge current is, for example, an average value of the currents supplied from the secondary battery 14 to the starter motor 18 at the starting time of the engine 17. The CPU 10a measures the starting time discharge current by the current sensor 12 at the starting time of the engine 17, and stores it as the parameter 10ca of the RAM 10c. In the step S5, the CPU 10a acquires the starting time discharge current Id stored at the RAM 10c. Note that an average value of the discharge currents at plural starting times may be used as the starting time discharge current Id.

In step S6, the CPU 10a acquires a starting time discharge time Td. Here, the starting time discharge time is a time for which, for example, the current is supplied from the secondary battery 14 to the starter motor 18 at the starting time of the engine 17. Specifically, the CPU 10a measures the starting time discharge time by the timer 10d at the starting time of the engine 17, and stores it as the parameter 10ca of the RAM 10c. In the step S6, the CPU 10a acquires the starting time discharge time Td stored at the RAM 10c. Note that an average value of starting times at the plural number of starting times may be used as the starting time discharge time Td.

In step S7, the CPU 10a calculates a diffusion resistance Rd based on the starting time discharge current Id and the starting time discharge time Td acquired at the steps S5, S6. Specifically, the CPU 10a stores a table or a relational expression representing the relationship among the discharge current, the discharge time and the diffusion resistance at the predetermined temperature (for example, 25° C.) illustrated in FIG. 4, as the parameter 10ca of the RAM 10c, and acquires a value of the diffusion resistance Rd corresponding to the starting time discharge current Id and the starting time discharge time Td acquired at the steps S5, S6 from the table or the relational expression.

In step S8, the CPU 10a acquires a temperature Tc of the secondary battery 14 in itself or the peripheral temperature thereof by the temperature sensor 13.

In step S9, the CPU 10a corrects the value of the diffusion resistance Rd calculated at the step S7 based on the temperature Tc acquired at the step S8. Specifically, a table or a relational expression representing a relationship between the temperature Tc and the diffusion resistance Rd is stored as the parameter 10ca of the RAM 10c to correct the value of the diffusion resistance Rd found at the step S7 based on the temperature Tc acquired at the step S8.

In step S10, the CPU 10a adds the value of the diffusion resistance Rd which is temperature corrected at the step S9 to the value of the internal resistance R found at the step S4, and newly stores the obtained value as the internal resistance R. The internal resistance R thereby becomes a value in which the diffusion resistance Rd is added.

In step S11, the CPU 10a acquires a voltage before starting Vb. Here, the voltage before starting is a voltage of the secondary battery 14 before the engine 17 is started. The CPU 10a measures the voltage before the engine 17 is started by the voltage sensor 11, and stores as the parameter 10ca of the RAM 10c. In the step S11, the CPU 10a acquires the voltage before starting Vb stored at the RAM 10c. Note that, for example, a voltage at a timing when a most recent discharge current is approximately "0" (zero) A, or a stable voltage estimated value may be used as the voltage before starting.

In step S12, the CPU 10a finds a starting voltage Vs (=Vb+R×Id) based on the voltage before starting Vb acquired at the step S11, the internal resistance R in which the corrected diffusion resistance Rd is added at the step S10 and the starting time discharge current Id acquired at the step S5. Note that it is possible to determine whether or not the starting of the engine 17 is possible or an exchange of the secondary battery 14 is necessary based on the starting voltage Vs found as stated above and the voltage of the secondary battery 14. A determination result obtained as stated above can be transmitted to, for example, the not-illustrated ECU and so on being a superior device via the communication part 10e.

The starting voltage Vs is found based on the value of the internal resistance R obtained by adding the diffusion resistance Rd generated resulting from the current flowing in the starter motor 18 at the starting time to the internal resistance R by the above-stated processes, and therefore, it is possible to accurately find the starting voltage Vs.

Besides, in the above-stated processes, the temperature whose variation is relatively large is set as a fixed value, and the diffusion resistance is found based on the starting time discharge current and the starting time discharge time whose variations are small, and the found diffusion resistance is corrected based on an actually measured temperature, and therefore, it is possible to speed-up the process by simplifying the calculation.

Further, in the above-stated embodiment, the internal resistance R excluding the diffusion resistance Rd which is not affected by deterioration of the secondary battery 14 illustrated in FIG. 6 is found, and based on the internal resistance R, the internal resistance suitable for the estimation of the starting voltage is calculated based on a sum with the diffusion resistance (R+Rd) based on the internal resistance R. It is thereby possible to enable both an accurate deterioration detection of the secondary battery 14 by using the former internal resistance R and an accurate estimation of the starting voltage by using the latter internal resistance (R+Rd) in which the diffusion resistance Rd is taken into account.

(C) Description of Modified Embodiment

The above-stated embodiment is just an example, and it goes without saying that the present invention is not limited to only the above-stated case. For example, in the above-stated embodiment, the internal resistance R is found by the pulse-discharge, but it may be found by a method other than the above. Specifically, for example, it is also possible to make the alternating current flow in the secondary battery 14, and find the internal resistance based on a voltage at that time.

Besides, in the above-stated embodiment, the temperature Tc is fixed at the predetermined value, and the diffusion resistance Rd is found based on the acquired starting time discharge current Id and the starting time discharge time Td. However, one of the starting time discharge current Id and the starting time discharge time Td may be fixed at a predetermined value, the diffusion resistance Rd is found based on a table or a relational expression representing a relationship between the other one and the temperature Tc, and thereafter, a correction is performed based on a parameter to be the fixed value. In more detail, the starting time discharge current Id is fixed at a predetermined value, the diffusion resistance Rd is found based on a table or a relational expression representing a relationship between the starting time discharge time Td and the temperature Tc, and a found value is corrected based on a measurement value of the starting time discharge current Id. Otherwise, the starting time discharge time Td is fixed at a predetermined value, the diffusion resistance Rd is found based on a table or a relational expression representing a relationship between the starting time discharge current Id and the temperature Tc, and a found value is corrected based on a measurement value of the starting time discharge time Td. Further, in the above-stated description, one parameter is fixed, but for example, the diffusion resistance Rd is found by fixing two parameters at predetermined values, and the diffusion resistance Rd may be corrected based on actually measured values of the fixed parameters.

Besides, a maximum current and time estimated in each vehicle may be used as the starting time discharge current and the starting time discharge time. In such a case, it is possible to further simplify the processes.

EXPLANATION OF REFERENCE SIGNS 1 secondary battery state detecting device
10 control part
10a CPU (measurement unit, estimation unit, calculation unit)
10b ROM
10c RAM
10d timer
10e communication part
10f I/F
11 voltage sensor (measurement unit)
12 current sensor (measurement unit)
13 temperature sensor
14 secondary battery
15 discharge circuit
16 alternator
17 engine
18 starter motor
19 load

The invention claimed is:

1. A secondary battery state detecting device detecting a state of a secondary battery mounted on a vehicle, comprising:
a measurement unit measuring a first value of an internal resistance of the secondary battery at an engine stop time;
a storage unit storing a data structure or a relational expression that comprises information indicating a temporal change of diffusion resistance resulting from diffusion of an ion generated in an electrolytic solution of the secondary battery with respect to a plurality of discharge current values associated with a plurality of discharge time values;
an estimation unit estimating, by applying different discharge currents and different discharge times at past plural starting times of the engine to the data structure or the relational expression, a second value of the diffusion resistance resulting from the diffusion of the ion generated in the electrolytic solution of the secondary battery by supplying electric power to a starter motor at a starting time of the engine, wherein the data structure or the relational expression stores different values of the diffusion resistance corresponding to the different discharge times; and
a calculation unit calculating a starting voltage being a voltage required for the starting of the engine from a resistance value obtained by adding the second value of the diffusion resistance estimated by the estimation unit to the first value of the internal resistance measured by the measurement unit, a starting current flowing when the engine is started, and a voltage before starting of the secondary battery.

2. The secondary battery state detecting device according to claim 1,
wherein the estimation unit corrects the second value of the diffusion resistance based on a temperature of the secondary battery.

3. The secondary battery state detecting device according to claim 2,
wherein the estimation unit estimates the second value of the diffusion resistance by setting at least one of the discharge current, the discharge time, and the temperature of the secondary battery as a fixed value, and setting the others as variable values, and an obtained value of the diffusion resistance is corrected based on a parameter which is set as the fixed value.

4. The secondary battery state detecting device according to claim 3,
wherein the estimation unit sets the temperature as the fixed value, the discharge current and the discharge time as the variable values, estimates the second value of the diffusion resistance based on the discharge current and the discharge time at a predetermined temperature, and corrects the second value of the diffusion resistance based on an actually measured temperature of the secondary battery.

5. The secondary battery state detecting device according to claim 1,
wherein the storage unit stores the information indicating the temporal change of the diffusion resistance with respect to the plurality of discharge current values at a predetermined temperature, and
wherein the estimation unit estimates the second value of the diffusion resistance by applying the discharge times to the information for the plurality of discharge current values stored in the storage unit, and corrects the second value of the diffusion resistance based on the temperature of the secondary battery at a corresponding time point.

6. The secondary battery state detecting device according to claim 1,
wherein the estimation unit measures current flowing through the starter motor and a time required for starting the engine at the past plural starting times, and estimates the second value of the diffusion resistance based on an average of measured values associated with the current.

7. The secondary battery state detecting device according to claim 1,
wherein the estimation unit employs a maximum torque point at which the voltage drops most excluding inrush current during cranking of the engine as current flows to the starter motor at the past plural starting times.

8. The secondary battery state detecting device according to claim 1,
wherein the estimation unit is adapted to estimate the second value of the diffusion resistance by measuring the starting current and the time required to start the engine a plurality of times, and the second value of the diffusion resistance is estimated based on averaged values of the time and the starting current.

9. The secondary battery state detecting device according to claim 8,
wherein the estimation unit corrects the second value of the diffusion resistance based on a temperature of the secondary battery.

10. The secondary battery state detecting device according to claim 8,
wherein the estimation unit is adapted to use a current at a time of maximum torque point of the starter motor where the voltage becomes the lowest other than an inrush current during cranking of the engine as the starting.

11. The secondary battery state detecting device according to claim 10,
wherein the estimation unit corrects the second value of the diffusion resistance based on a temperature of the secondary battery.

12. A secondary battery state detecting method detecting a state of a secondary battery mounted on a vehicle, comprising:
a measurement step measuring a first value of an internal resistance of the secondary battery at an engine stop time;
a storage step storing a data structure or a relational expression that comprises information indicating a temporal change of diffusion resistance resulting from diffusion of an ion generated in an electrolytic solution of the secondary battery with respect to a plurality of discharge current values associated with a plurality of discharge time values;
an estimation step estimating, by applying different discharge currents and different discharge times at past plural starting times of the engine to the data structure or the relational expression, a second value of the diffusion resistance resulting from the diffusion of the ion generated in the electrolytic solution of the secondary battery by supplying electric power to a starter motor at a starting time of the engine, wherein the data structure or the relational expression stores different values of the diffusion resistance corresponding to the different discharge times; and
a calculation step calculating a starting voltage being a voltage required for the starting of the engine from a resistance value obtained by adding the second value of the diffusion resistance estimated at the estimation step to the first value of the internal resistance measured at the measurement step, a starting current flowing when the engine is started, and a voltage before starting of the secondary battery.

13. A secondary battery state detecting device for detecting a state of a secondary battery mounted on a vehicle, comprising:
one or more processors;
one or more memory modules communicatively coupled to the one or more processors; and
machine readable instructions stored in the one or more memory modules that cause the secondary battery state detecting device to perform at least the following when executed by the one or more processors:
a measurement unit for measuring a first value of an internal resistance of the secondary battery at an engine stop time;
a storage unit for storing a data structure or a relational expression that comprises information indicating a temporal change of diffusion resistance resulting from diffusion of an ion generated in an electrolytic solution of the secondary battery with respect to a plurality of discharge current values associated with a plurality of discharge time values;
an estimation unit for estimating, by applying different discharge currents and different discharge times at past plural starting times of the engine to the data structure or the relational expression, a second value of the diffusion resistance resulting from the diffusion of the ion generated in the electrolytic solution of the secondary battery by supplying electric power to a starter motor at a starting time of the engine, wherein the data structure or the relational expression stores different values of the diffusion resistance corresponding to the different discharge times; and
a calculation unit for calculating a starting voltage being a voltage required for the starting of the engine from a resistance value obtained by adding the second value of the diffusion resistance estimated by the estimation unit to the first value of the internal resistance measured by the measurement unit, a starting current flowing when the engine is started, and a voltage before starting of the secondary battery.

* * * * *